United States Patent
Zhang et al.

(10) Patent No.: US 12,069,830 B2
(45) Date of Patent: Aug. 20, 2024

(54) DIRECT CURRENT CONNECTOR, ALTERNATING CURRENT/DIRECT CURRENT INPUT DEVICE, AND ALTERNATING CURRENT/DIRECT CURRENT INPUT SYSTEM

(71) Applicant: Huawei Technologies Co., Ltd., Shenzhen (CN)

(72) Inventors: Guoqing Zhang, Shenzhen (CN); Jiangtao Wang, Shenzhen (CN); Liang Gao, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 446 days.

(21) Appl. No.: 17/373,313

(22) Filed: Jul. 12, 2021

(65) Prior Publication Data

US 2021/0345508 A1   Nov. 4, 2021

Related U.S. Application Data

(63) Continuation of application No. 16/448,296, filed on Jun. 21, 2019, now Pat. No. 11,096,303, which is a
(Continued)

(30) Foreign Application Priority Data

Dec. 27, 2016 (CN) .......................... 201611230074.X
Mar. 23, 2017 (CN) .......................... 201710177821.6

(51) Int. Cl.
*H05K 5/00*   (2006.01)
*H01R 13/04*   (2006.01)
(Continued)

(52) U.S. Cl.
CPC ............ *H05K 7/1455* (2013.01); *H01R 13/04* (2013.01); *H01R 13/10* (2013.01); *H01R 13/71* (2013.01); *H02M 3/33592* (2013.01)

(58) Field of Classification Search
CPC ...... H05K 7/1455; H01R 13/04; H01R 13/10; H01R 13/71; H02M 3/33592
(Continued)

(56) References Cited

U.S. PATENT DOCUMENTS 7,190,091 B1    3/2007  Marshall
2006/0116023 A1  6/2006  Spitaels et al.
(Continued)

FOREIGN PATENT DOCUMENTS

CN    102075081 A    5/2011
CN    102222848 A   10/2011
(Continued)

OTHER PUBLICATIONS

"Direct current power feeding interface up to 400 V at the input to telecommunication and ICT equipment," ITU-T L.1200, Series L: Construction, Installation, and Protection of Cables and Other Elements of Outside Plant, pp. 1-18, International Telecommunication Union, Geneva, Switzerland (May 2012).
(Continued)

*Primary Examiner* — Binh B Tran
(74) *Attorney, Agent, or Firm* — Leydig, Voit & Mayer, Ltd.

(57) ABSTRACT

An alternating current/direct current input device includes an appliance input socket and an information and communications technology (ICT) device. The ICT device is powered by the appliance input socket. The appliance input socket includes a ground contact, a positive electrode contact, a negative electrode contact, and a signal switch. A contact depth of the signal switch in the appliance input
(Continued)

socket is less than a contact depth of the positive electrode contact or the negative electrode contact in the appliance input socket. The signal switch is configured to generate a control signal when a direct current connector is separated from the appliance input socket. The control signal can be used to enable the ICT device to disconnect the appliance input socket from a conductive electrode of the direct current connector after the ICT device enters a no load state.

20 Claims, 12 Drawing Sheets

Related U.S. Application Data continuation of application No. PCT/CN2017/106551, filed on Oct. 17, 2017.

(51) Int. Cl.
*H01R 13/10* (2006.01)
*H01R 13/71* (2006.01)
*H05K 7/14* (2006.01)
*H02M 3/335* (2006.01)

(58) Field of Classification Search
USPC .......................................... 361/796
See application file for complete search history.

(56) References Cited

U.S. PATENT DOCUMENTS

| 2011/0122663 A1* | 5/2011 | Huang | H02H 9/004 |
| | | | 363/50 |
| 2012/0184132 A1* | 7/2012 | Katou | H01R 13/64 |
| | | | 439/535 |
| 2014/0073189 A1 | 3/2014 | Kondou et al. | |
| 2016/0015021 A1 | 1/2016 | Green | |
| 2016/0105021 A1 | 4/2016 | Murray | |
| 2016/0118782 A1 | 4/2016 | Zhang et al. | |

FOREIGN PATENT DOCUMENTS

| CN | 102832514 A | 12/2012 |
| CN | 102969694 A | 3/2013 |
| CN | 103117467 A | 5/2013 |
| CN | 105406290 A | 3/2016 |
| CN | 105644384 A | 6/2016 |
| CN | 103647441 B | 8/2016 |
| CN | 107017531 A | 8/2017 |

OTHER PUBLICATIONS

"Appliance couplers for household and similar general purposes—Part 1: General requirements," International Standard, IEC 60320-1, Edition 3.0, total 66 pages, International Electrotechnical Commission, Geneva, Switzerland (Jun. 2015).
U.S. Appl. No. 16/448,296, filed Jun. 21, 2019.

* cited by examiner

DIRECT CURRENT CONNECTOR, ALTERNATING CURRENT/DIRECT CURRENT INPUT DEVICE, AND ALTERNATING CURRENT/DIRECT CURRENT INPUT SYSTEM

CROSS-REFERENCE TO RELATED APPLICATIONS

This application is a continuation of U.S. patent application Ser. No. 16/448,296, filed on Jun. 21, 2019, which is a continuation of International Application No. PCT/CN2017/106551, filed on Oct. 17, 2017, which claims priority to Chinese Patent Application No. 201710177821.6, filed on Mar. 23, 2017 and Chinese Patent Application No. 201611230074.X, filed on Dec. 27, 2016. All of the aforementioned applications are hereby incorporated by reference in their entireties.

TECHNICAL FIELD

This application relates to the circuit field, and in particular, to a direct current connector, an alternating current/direct current input device, and an alternating current/direct current input system.

BACKGROUND

In recent years, high-voltage direct current (HVDC) is rapidly developing in the field of information and communications technologies (ICT), and some ICT equipment rooms supply power by using HVDC. In this case, an ICT device receives, by using a dedicated HVDC appliance input socket, electric energy provided by the ICT equipment room. However, some conventional ICT equipment rooms still supply power by using alternating current (AC). In this case, the ICT device receives, by using an AC appliance input socket that complies with the IEC 60320 standard, electric energy provided by the ICT equipment room.

In the current market, there are an AC appliance input socket that complies with the IEC 60320 standard and a dedicated HVDC appliance input socket. Therefore, the ICT device is designed as an AC version or an HVDC version. The AC version uses the AC appliance input socket that complies with the IEC 60320 standard, and the HVDC version uses the dedicated HVDC appliance input socket, so as to adapt to the power supply of ICT equipment rooms. As a result, when there are a large quantity of ICT devices, the ICT devices cannot flexibly adapt to the ICT equipment rooms.

It is of great significance to design an alternating current/direct current input solution in which AC is compatible with HVDC, so that AC and HVDC are compatible in an appliance coupler, and AC input and HVDC input are compatible in the ICT device, so as to flexibly adapt to the ICT equipment rooms.

SUMMARY

Embodiments of this application provide a direct current connector, an alternating current/direct current input device, and an alternating current/direct current input system, so as to resolve a problem that alternating current input and direct current input are incompatible in an appliance coupler and an ICT device, and the appliance coupler and the ICT device cannot flexibly adapt to ICT equipment rooms.

Exemplary technical solutions provided in embodiments of this application are as follows.

According to a first aspect, an embodiment of this application provides an alternating current/direct current input device, including an appliance input socket and an information and communications technology (ICT) device, where the ICT device is powered by the appliance input socket, the appliance input socket includes a ground contact, a positive electrode contact, a negative electrode contact, and a signal switch, and a contact depth of the signal switch in the appliance input socket is less than a contact depth of the positive electrode contact or the negative electrode contact in the appliance input socket; and the signal switch is configured to generate a control signal when a connector is separated from the appliance input socket, where the control signal can be used to enable the ICT device to disconnect the appliance input socket from a conductive electrode of the direct current connector after the ICT device enters a no load state.

By using the foregoing solution, when the connector is separated from the appliance input socket after the connector is inserted into the appliance input socket, because the contact depth of the signal switch in the appliance input socket is less than the contact depth of the positive electrode contact or the negative electrode contact in the appliance input socket, the signal switch can generate the control signal before the appliance input socket is disconnected from the conductive electrode of the connector, and the control signal can be used to enable the ICT device to disconnect the appliance input socket from the conductive electrode of the connector after the ICT device enters a no load state. In this case, a breaking current is basically zero during conductive electrode separation, thereby preventing the appliance coupler from generating a dangerous alternating current/direct current arc. In this way, alternating current input and direct current input are compatible in the appliance input socket, and the appliance input socket can flexibly adapt to ICT equipment rooms.

With reference to the first aspect, in a possible implementation, when the connector is a direct current connector, the signal switch is further configured to:

generate the control signal when the direct current connector is separated from the appliance input socket, where the control signal can be used to enable a load current of the ICT device to be zero or be close to zero before the appliance input socket is disconnected from the conductive electrode of the direct current connector.

In the foregoing possible implementation, the control signal is used to enable the load current of the ICT device to be zero or be close to zero before the appliance input socket is disconnected from the conductive electrode of the direct current connector, and used to control the ICT device to enter a no load state, so as to prevent the appliance coupler from generating a dangerous direct current arc.

With reference to the first aspect, in a possible implementation, a control circuit and a transformer coil are disposed inside the ICT device, the control circuit includes a control unit and a semiconductor switch, the control unit is connected to two conductive electrodes of the appliance input socket and is connected to the signal switch, a first end and a second end of the semiconductor switch are connected to a connection line between a conductive electrode of the appliance input socket and the transformer coil, and a third end of the semiconductor switch is connected to the control unit; and the control unit is configured to: after the control signal generated by the signal switch is received, control the semiconductor switch to enter a disconnected state, so that the ICT device disconnects the appliance input socket from the conductive electrode of the direct current connector after the ICT device enters a no load state.

In the foregoing possible implementation, after the control signal generated by the signal switch is received, the semiconductor switch inside the ICT device is controlled to enter a disconnected state, so that the ICT device enters a no load state. Therefore, it is simple and easy to enable the ICT device to quickly enter a no load state.

With reference to the first aspect, in a possible implementation, the semiconductor switch is a transistor or a combination of at least two transistors.

With reference to the first aspect, in a possible implementation, the control circuit further includes a start resistor and a relay, the start resistor is connected to the relay in parallel, and is connected to a connection line between a conductive electrode of the appliance input socket and the transformer coil, and the control unit is connected to the relay; and the control unit is further configured to: after power input is detected, control the relay to be connected and to enter a normal working state.

In the foregoing possible implementation, because the relay inside the ICT device is in a shutdown state by default, when the connector is inserted into the appliance input socket, a startup current inside the ICT device is extremely small under action of the start resistor, and an arc generated during startup of the appliance coupler can be controlled to an acceptable degree. After a preset duration, the control unit controls the relay to be connected and to enter a normal working state, thereby implementing a secure boot of the ICT device, preventing a dangerous current arc, and prolonging life spans of the ICT device and the appliance coupler.

With reference to the first aspect, in a possible implementation, when the connector is an alternating current connector, the signal switch is further configured to remain in an initial state when the alternating current connector is inserted into the appliance input socket.

With reference to the first aspect, in a possible implementation, when the connector is an alternating current connector, the signal switch is further configured to remain in an initial state when the alternating current connector is separated from the appliance input socket.

In the foregoing possible implementation, when the alternating current connector is inserted into the appliance input socket, the signal switch remains in an initial state, so that the appliance input socket can multiplex alternating current input, thereby implementing compatibility between alternating current input and direct current input.

With reference to the first aspect, in a possible implementation, the alternating current connector is a standard alternating current connector IEC 60320-C13 or a standard alternating current connector IEC 60320-C19.

With reference to the first aspect, in a possible implementation, the control unit is connected to the two conductive electrodes of the appliance input socket by using a power conversion module.

In the foregoing possible implementation, the control unit converts a voltage that is input by the conductive electrode into a working voltage of the control unit by using the power conversion module.

According to a second aspect, an embodiment of this application provides a direct current connector, including a ground contact, a positive electrode contact, a negative electrode contact, and a signal contact, where the signal contact is configured to: change a state when the direct current connector is separated from an appliance input socket, and trigger a signal switch K1 on the appliance input socket to generate a control signal, where the control signal can be used to enable an information and communications technology (ICT) device powered by the appliance input socket to disconnect the appliance input socket from a conductive electrode of the direct current connector after the ICT device enters a no load state.

By using the foregoing solution, a state change first occurs when the direct current connector is separated from the appliance input socket, so that the appliance input socket is disconnected from the conductive electrode of the direct current connector after the ICT device enters a no load state, thereby preventing the appliance coupler from generating a dangerous direct current arc, avoiding electrical fire and electrical injury accidents, protecting an operator of a terminal that provides direct current power by using a connector, and extending an application field of a direct current power supply system.

With reference to the second aspect, in a possible implementation, the signal contact is a fixed contact, so as to be differentiated from an alternating current connector in appearance.

In the foregoing possible implementation, the signal contact is set to be fixed, and can be clearly differentiated from the alternating current connector in appearance, so as to prevent an operator from wrongly inserting the direct current connector into an alternating current appliance input socket due to similar appearance, thereby preventing damaging the alternating current appliance input socket and the ICT device powered by the alternating current appliance input socket, and even avoiding a dangerous accident.

With reference to the second aspect, in a possible implementation, the signal contact is a movable contact; when the positive electrode contact and the negative electrode contact output a direct current, the signal contact is in an elongated state; and when the positive electrode contact and the negative electrode contact output an alternating current, the signal contact is in a contracted state.

In the foregoing possible implementation, the signal contact is set to be movable, so that the direct current connector can be used as an alternating current connector. Therefore, alternating current input and direct current input can be flexibly compatible, so as to provide convenience for a user.

According to a third aspect, an embodiment of this application provides an alternating current/direct current input system, including a connector, an appliance input socket, and an information and communications technology (ICT) device, where the ICT device is powered by the appliance input socket, the connector is a direct current connector or an alternating current connector, the direct current connector includes a ground contact, a positive electrode contact, a negative electrode contact, and a signal contact, and the appliance input socket includes a ground contact, a positive electrode contact, a negative electrode contact, and a signal switch;

the signal contact is configured to: change a state when the direct current connector is separated from the appliance input socket, and trigger the signal switch on the appliance input socket to generate a control signal, where the control signal can be used to enable the information and communications technology ICT device powered by the appliance input socket to disconnect the appliance input socket from a conductive electrode of the direct current connector after the ICT device enters a no load state; and the signal switch is configured to generate the control signal when the direct current connector is separated from the appliance input socket, where the control signal can be used to enable the ICT device to disconnect the appliance input socket from the conductive electrode of the direct current connector after the ICT device enters a no load state.

By using the foregoing solution, alternating current input and direct current input are compatible in the alternating current/direct current input system, and can be flexibly selected based on an actual situation, so as to adapt to ICT equipment rooms.

With reference to the third aspect, in a possible implementation, the alternating current connector is a standard alternating current connector IEC 60320-C13 or a standard alternating current connector IEC 60320-C19.

With reference to the third aspect, in a possible implementation, the signal contact is a movable contact; when the positive electrode contact and the negative electrode contact output a direct current, the signal contact is in an elongated state; and when the positive electrode contact and the negative electrode contact output an alternating current, the signal contact is in a contracted state.

DESCRIPTION OF EMBODIMENTS

To better understand objectives, solutions, and advantages of embodiments of this application, the following provides detailed descriptions. The detailed descriptions provide various implementations of a device and/or a method by using block diagrams, flowcharts, and/or examples. These block diagrams, flowcharts, and/or examples include one or more functions and/or operations. A person in the art may understand that each function and/or operation in the block diagrams, the flowcharts, and/or the examples can be performed independently and/or jointly by using various kinds of hardware, software, and firmware, and/or any combination thereof.

Embodiments of this application provide a direct current connector, an input device, and a system, so as to resolve a problem that AC input and HVDC input are incompatible in an appliance coupler and an ICT device, and the appliance coupler and the ICT device cannot flexibly adapt to ICT equipment rooms.

The following explains basic concepts in embodiments of this application. It should be noted that these explanations are intended to facilitate understanding of the embodiments of this application, and should not be considered as a limitation on the protection scope of this application.

1. HVDC and AC

HVDC is a new direct current power supply mode different from conventional −48 Vdc (voltage direct current), and a power supply voltage is higher than −48 Vdc. A rated value is 240 Vdc, and a range is from 192 Vdc to 288 Vdc; or a rated value is 336 Vdc, and a range is from 260 Vdc to 400 Vdc. The voltage range is defined by the standard ITU/L.1200.

AC is usually referred to as "mains" or an "industrial frequency alternating current", and is usually characterized by three vectors: a voltage, a current, and a frequency. Currently, common mains frequencies in the world are 50 Hertz (Hz) and 60 Hz, and the voltage ranges from 100 V to 250 V.

2. Appliance Coupler, Connector, and Appliance Input Socket

An appliance coupler is a coupler that may be connected to or disconnected from an ICT device by using a power cord, and is comprised by two parts: a connector and an appliance input socket.

A connector is a part integrated with a soft cable connected to a power supply, or a part configured to be connected to the soft cable, and an electrical connection part of the connector is a socket. The connector includes two types: a direct current connector and an alternating current connector. The direct current connector receives direct current input, and the alternating current connector receives alternating current input.

An appliance input socket is a part inside an ICT device or is fastened to an ICT device, or a part configured to be installed on an ICT device, and an electrical connection part of the appliance input socket is a pin.

The following describes embodiments of this application in detail with reference to accompanying drawings.

Figure 1:
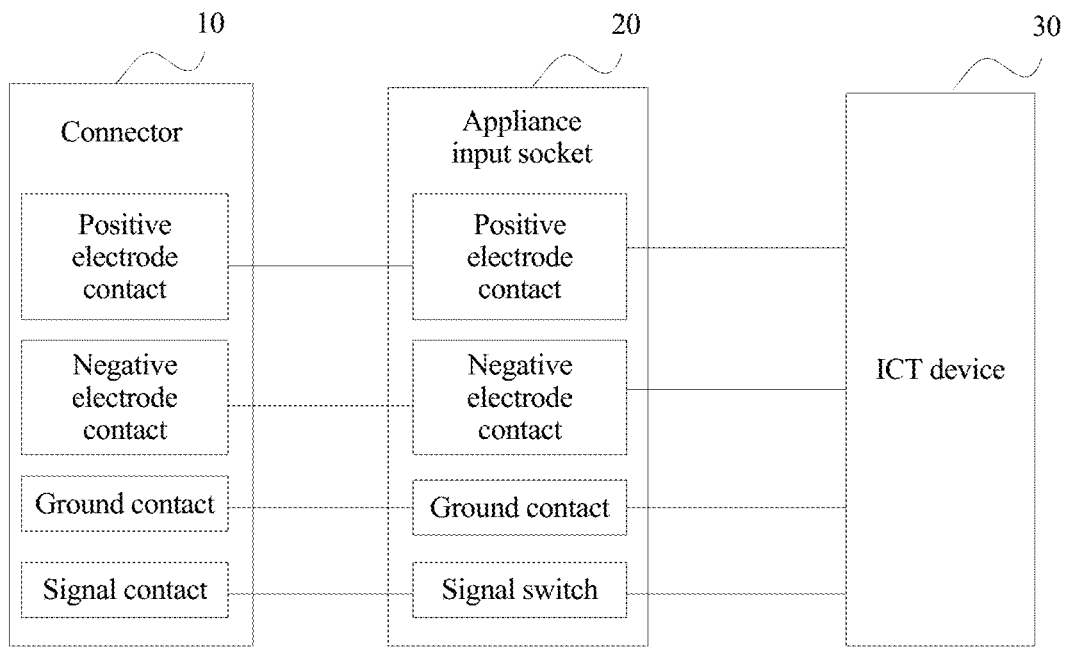
FIG. 1 is a schematic composition diagram of an alternating current/direct current input system according to an embodiment of this application.

As shown in FIG. 1, an embodiment of this application provides an alternating current/direct current input system, including a connector 10, an appliance input socket 20, and an ICT device 30. The ICT device 30 is powered by the appliance input socket 20. The appliance input socket 20 may be fastened inside the ICT device 30, or may be configured to be connected to the ICT device 30. The connector 10 may be a direct current connector or an alternating current connector. The alternating current connector is a standard alternating current connector IEC 60320-C13 or a standard alternating current connector IEC 60320-C19. The direct current connector includes a ground contact, a positive electrode contact, a negative electrode contact, and a signal contact. The appliance input socket 20 includes a ground contact, a positive electrode contact, a negative electrode contact, and a signal switch K1.

The signal contact is configured to: change a state when the direct current connector is separated from the appliance input socket 20, and trigger the signal switch K1 on the appliance input socket 20 to generate a control signal, where the control signal can be used to enable the ICT device 30 powered by the appliance input socket 20 to disconnect the appliance input socket 20 from a conductive electrode of the direct current connector after the ICT device enters a no load state.

The signal switch K1 is configured to generate the control signal when the direct current connector is separated from the appliance input socket 20, where the control signal can be used to enable the ICT device 30 to disconnect the appliance input socket 20 from the conductive electrode of the direct current connector after the ICT device enters a no load state.

Figure 2:
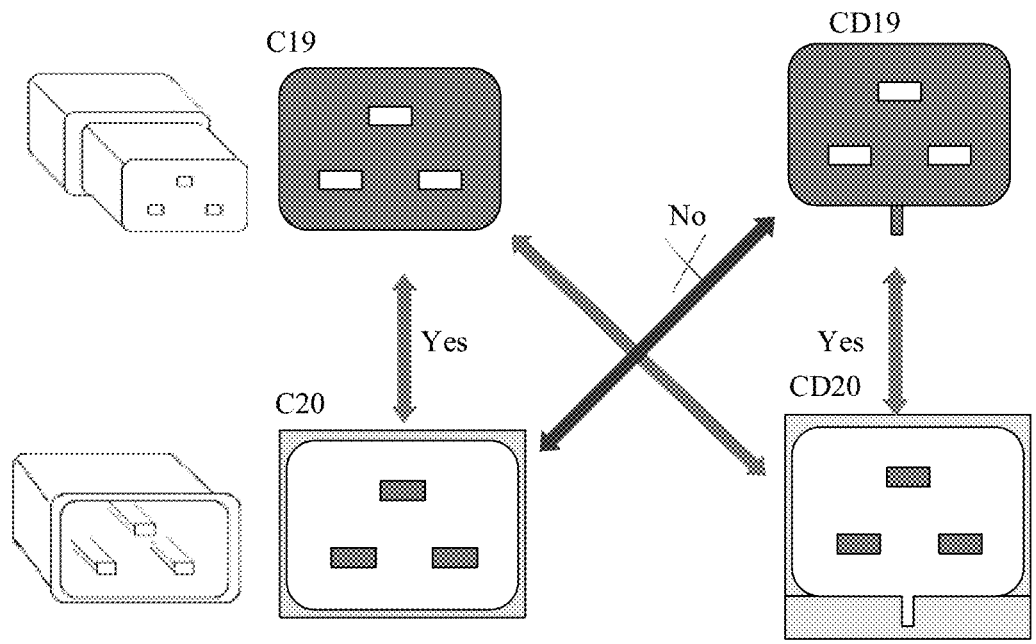
FIG. 2 is a schematic diagram of coupling between a direct current connector and an appliance coupler according to an embodiment of this application.

It should be noted that, in this embodiment of this application, the direct current connector and the appliance input socket 20 constitute an appliance coupler. The direct current connector and the appliance input socket 20 may be obtained by improving a standard appliance coupler such as IEC 60320-C13/C14 and IEC 60320-C19/C20, and are referred to as CD13/CD14 and CD19/CD20 in this specification. The signal contact on the direct current connector may be fixed or movable. When the signal contact on the direct current connector is fixed, the signal contact is used to be differentiated from the alternating current connector in appearance and size. When the signal contact on the direct current connector is fixed or when the signal contact is movable and is in an elongated state, CD13 can be inserted into CD14, CD19 can be inserted into CD20, C13 can be inserted into CD14, C19 can be inserted into CD20, CD13 cannot be inserted into C14, and CD19 cannot be inserted into C20. For details, refer to FIG. 2. Herein, C19/C20 and CD19/CD20 are used as an example for illustration, which is also applicable to C13/C14 and CD13/CD14.

Further, when the signal contact on the direct current connector is movable and the signal contact is in a contracted state, CD13 can be inserted into CD14, CD19 can be inserted into CD20, C13 can be inserted into CD14, C19 can be inserted into CD20, CD13 can be inserted into C14, and CD19 can be inserted into C20.

Figure 3A:
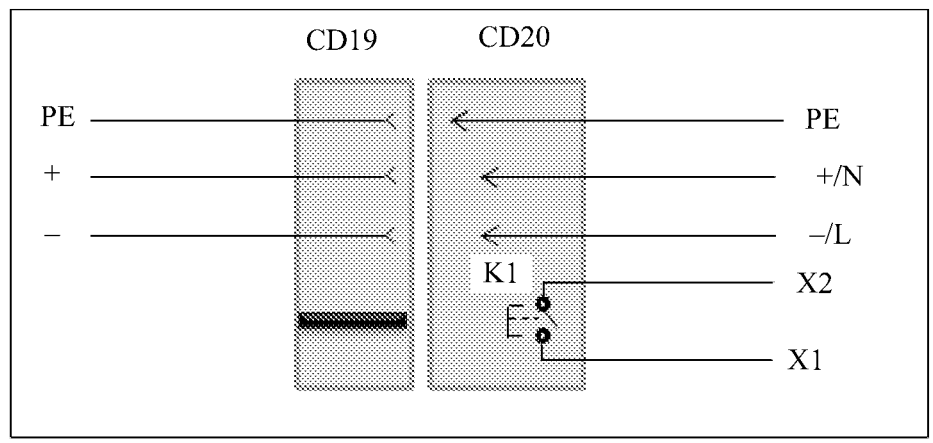
FIG. 3A, FIG. 3B, FIG. 3E, and FIG. 3F are schematic structural diagrams of a direct current connector and an appliance coupler according to an embodiment of this application.
Figure 3B:
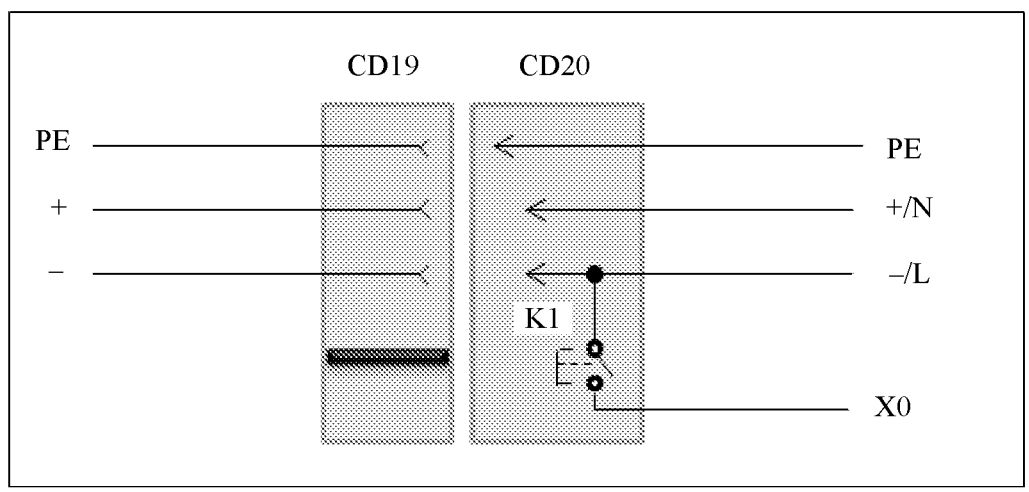

Further, an example in which the direct current connector and the appliance input socket 20 are CD19 and CD20 is used in FIG. 3A and FIG. 3B to show schematic structural diagrams of the direct current connector and the appliance input socket. It can be seen from FIG. 3A and FIG. 3B that the signal switch K1 of the appliance input socket 20 is connected to an internal circuit of the ICT device. Herein, CD19/CD20 is used as an example, which is also applicable to CD13/CD14. For details, refer to FIG. 3E and FIG. 3F.

Figure 3C:
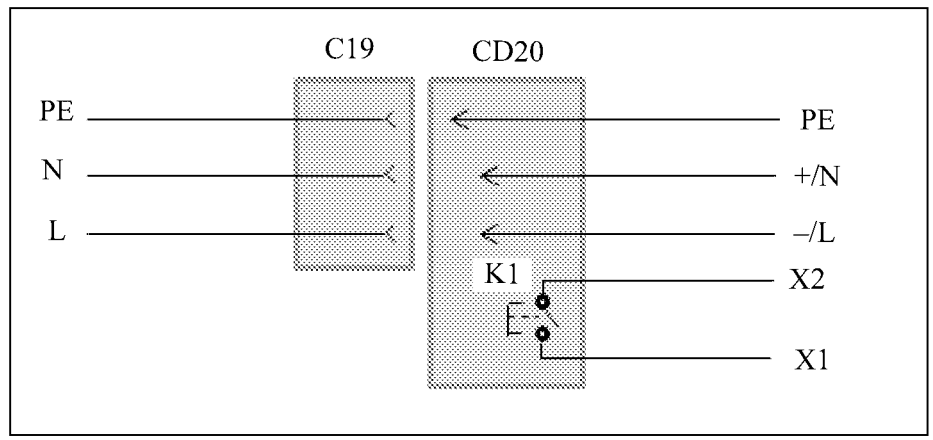
FIG. 3C, FIG. 3D, FIG. 3G and FIG. 3H are schematic structural diagrams of an alternating current connector and an appliance coupler according to an embodiment of this application.
Figure 3D:
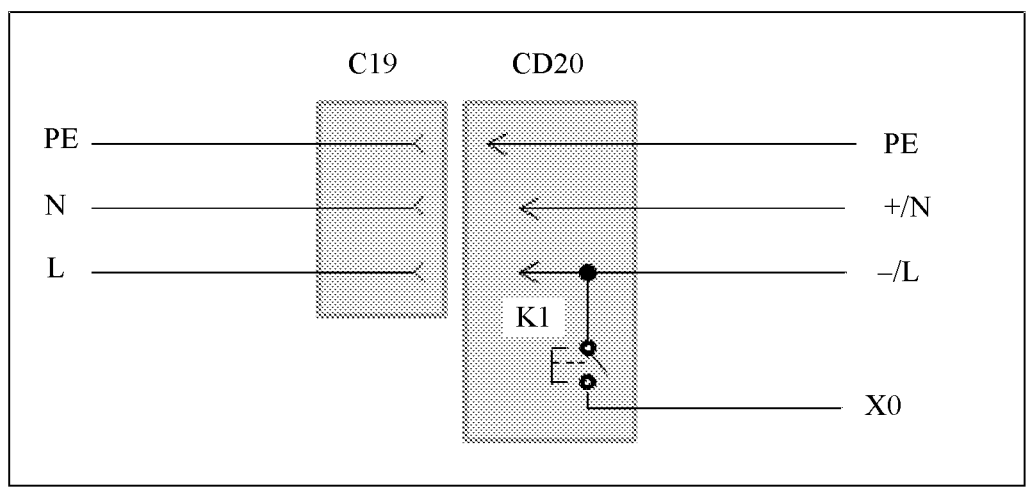
Figure 3E:
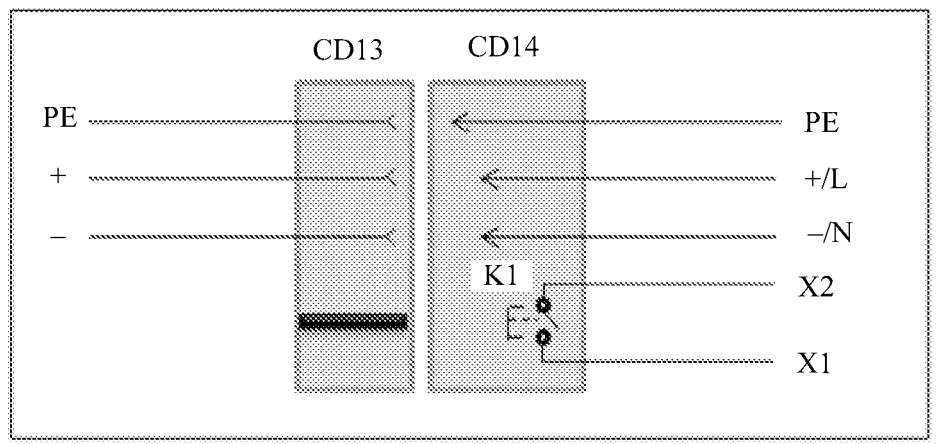
Figure 3F:
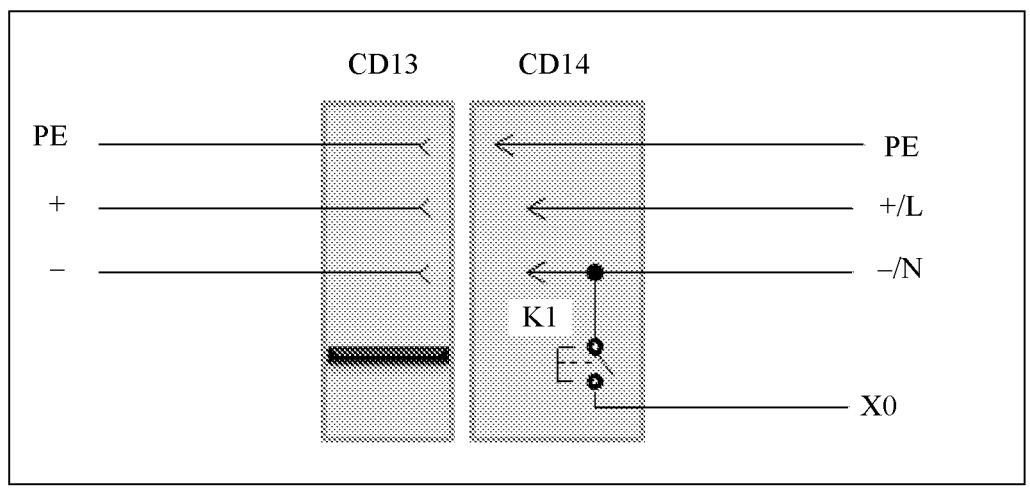
Figure 3G:
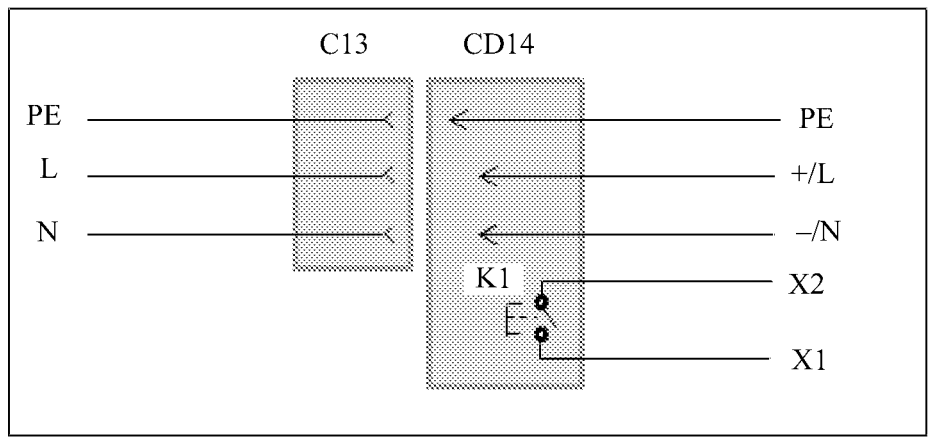
Figure 3H:
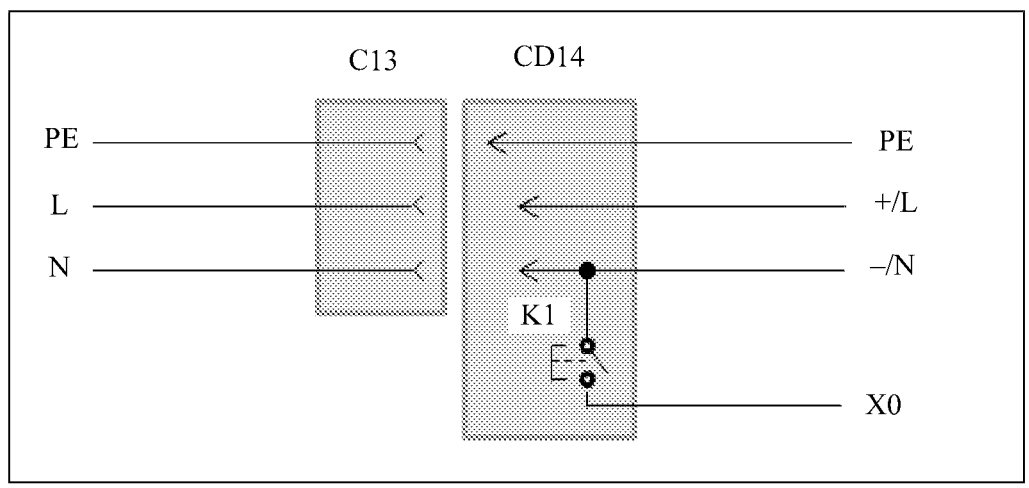

Further, an example in which the alternating current connector is the standard alternating current connector IEC 60320-C19 and the appliance input socket 20 is CD20 is used in FIG. 3C and FIG. 3D to show schematic structural diagrams of the alternating current connector and the appliance input socket. Likewise, the alternating current connector may also be the standard alternating current connector IEC 60320-C13, and the appliance input socket 20 is CD14. For details, refer to FIG. 3G and FIG. 3H.

Based on the foregoing embodiment, an embodiment of this application provides a direct current connector. As shown in FIG. 3A or FIG. 3B, the direct current connector includes a ground contact, a positive electrode contact, a negative electrode contact, and a signal contact.

The signal contact is configured to: change a state when the direct current connector is separated from an appliance input socket, and trigger a signal switch K1 on the appliance input socket to generate a control signal, where the control signal can be used to enable an information and communications technology (ICT) device powered by the appliance input socket to disconnect the appliance input socket from a conductive electrode of the direct current connector after the ICT device enters a no load state.

In a possible implementation, the signal contact is a fixed contact. In this case, the direct current connector can receive only HVDC input, and can be used only as a direct current connector.

In another possible implementation, the signal contact is a movable contact, and the signal contact is further configured to present an elongated state when the positive electrode contact and the negative electrode contact output a direct current, for example, an HVDC. In this implementation, if the signal contact is in a contracted state, the direct current connector may receive alternating current input, and is used as an alternating current connector. When the signal contact is a movable contact, the direct current connector can receive both direct current input and alternating current input. When the signal contact is in an elongated state, the direct current connector is used as a direct current connector; and when the signal contact is in a contracted state, the direct current connector is used as an alternating current connector.

Figure 4:
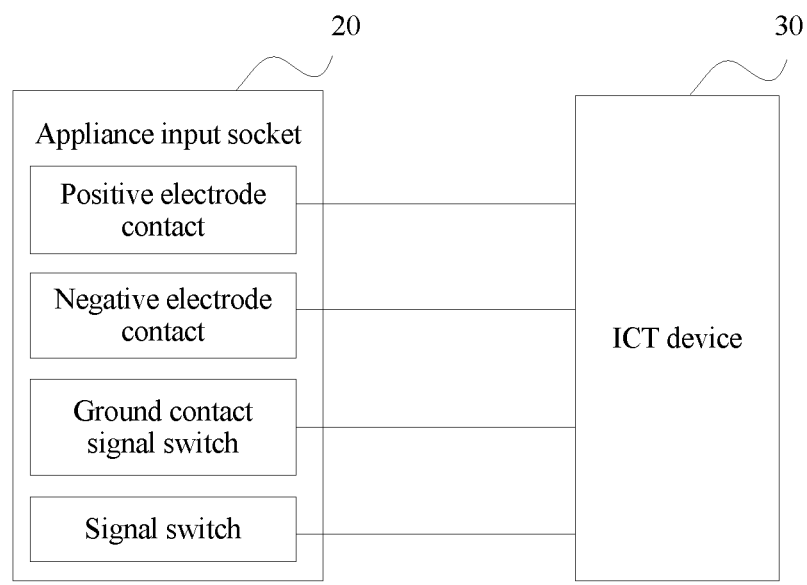
FIG. 4 is a schematic composition diagram of an alternating current/direct current input device according to an embodiment of this application.

An embodiment of this application provides an alternating current/direct current input device. As shown in FIG. 4, the alternating current/direct current input device includes an appliance input socket 20 and an ICT device 30. The ICT device 30 is powered by the appliance input socket 20. The appliance input socket 20 may be fastened inside the ICT device 30, or may be configured to be connected to the ICT device 30. The appliance input socket 20 includes a ground contact, a positive electrode contact, a negative electrode contact, and a signal switch K1. A contact depth of the signal switch K1 in the appliance input socket 20 is less than a contact depth of the positive electrode contact or the negative electrode contact in the appliance input socket 20. In this case, the contact depth of the signal switch K1 in the appliance input socket 20 is shorter, so that the signal switch is first disconnected when the appliance input socket 20 is separated from a direct current connector, so as to generate a control signal. It should be noted that the contact depth is a dent depth at which the connector can be penetrated starting from contact with the connector. In actual application, contact depths of the positive electrode contact and the negative electrode contact in the appliance input socket are the same, and are less than a contact depth of the ground contact. In this case, a ground electrode are first connected when the connector is inserted, and the ground electrode is last disconnected when the connector is removed, so as to ensure ground protection in a power-on process of the ICT device.

The signal switch K1 is configured to generate a control signal when the direct current connector is separated from the appliance input socket 20, where the control signal can be used to enable the ICT device 30 to disconnect the appliance input socket 20 from a conductive electrode of the direct current connector after the ICT device enters a no load state. In this case, the direct current connector may be the direct current connector shown in FIG. 3A or FIG. 3B.

Optionally, the signal switch K1 is further configured to:
generate the control signal when the direct current connector is separated from the appliance input socket 20, where the control signal can be used to enable a load current of the ICT device 30 to be zero before the appliance input socket 20 is disconnected from the conductive electrode of the direct current connector. Optionally, in a possible implementation, the control signal is used to enable a load current of the ICT device 30 to be close to zero before the appliance input socket 20 is disconnected from the conductive electrode of the direct current connector. For example, when a current is less than a preset value, the current is considered to be close to zero.

Figure 5A:
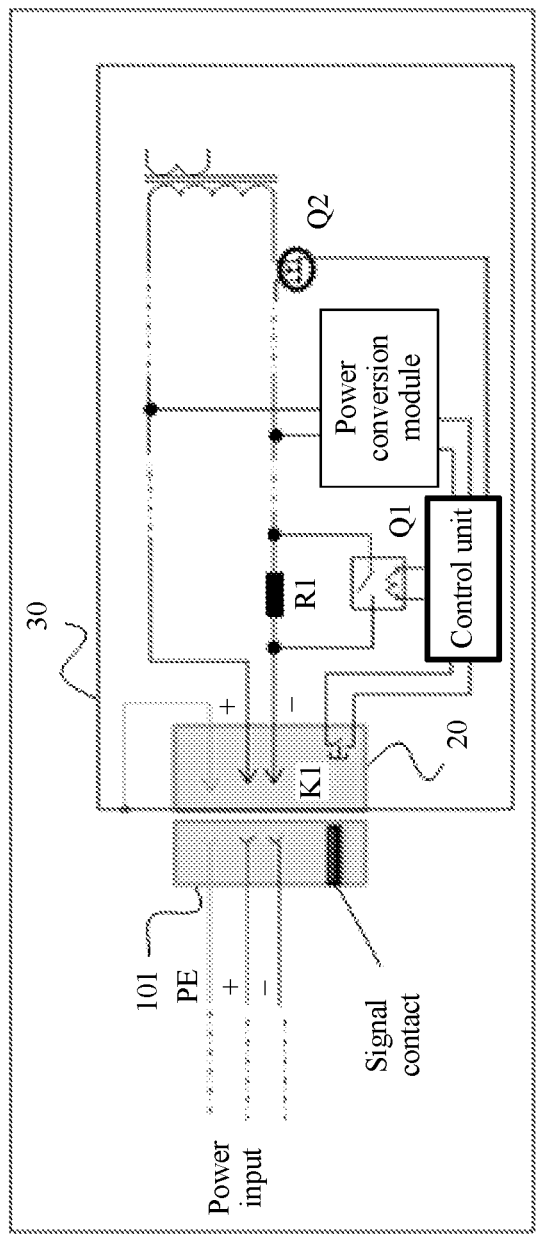
FIG. 5A and FIG. 5B are schematic diagrams of connections between a direct current connector, an appliance input socket, and an ICT device.

Further, FIG. 5A shows a possible implementation of a direct current connector 101, an appliance input socket 20, and an ICT device 30. In FIG. 5A, the appliance input socket 20 is integrated inside the ICT device 30, and a signal switch K1 of the appliance input socket 20 is connected to an internal circuit of the ICT device 30. Certainly, the signal switch K1 of the appliance input socket 20 may also be connected to the internal circuit of the ICT device 30 in another manner. In this case, reference may be made to FIG. 5B.

Figure 5B:
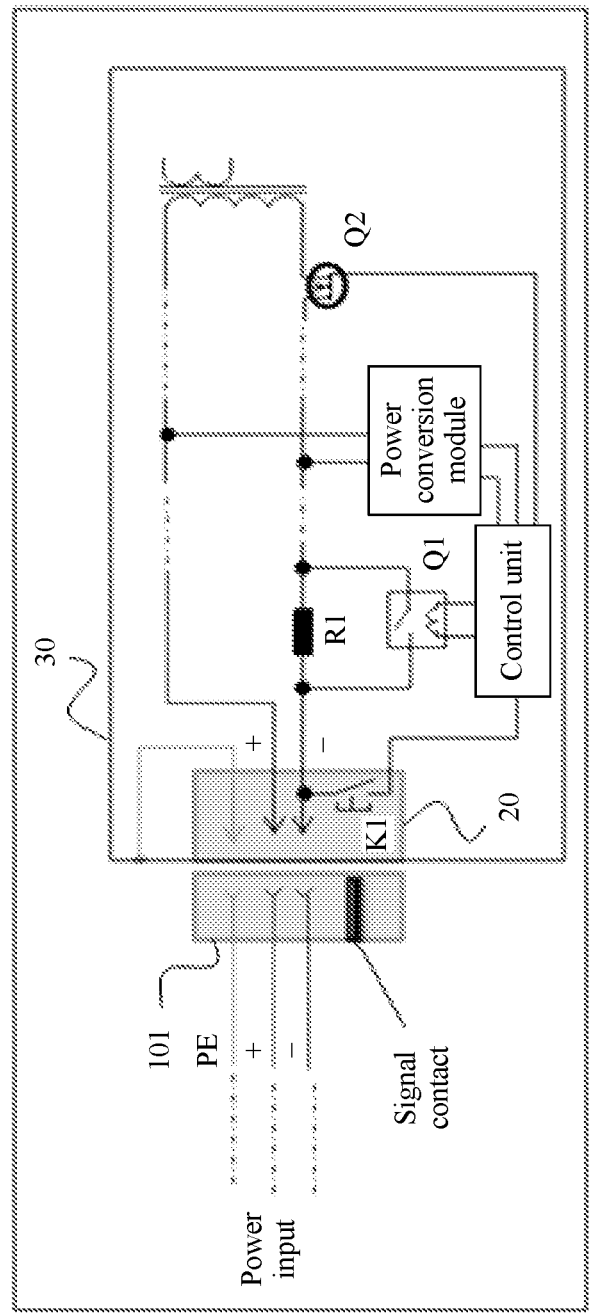
Figure 5C:
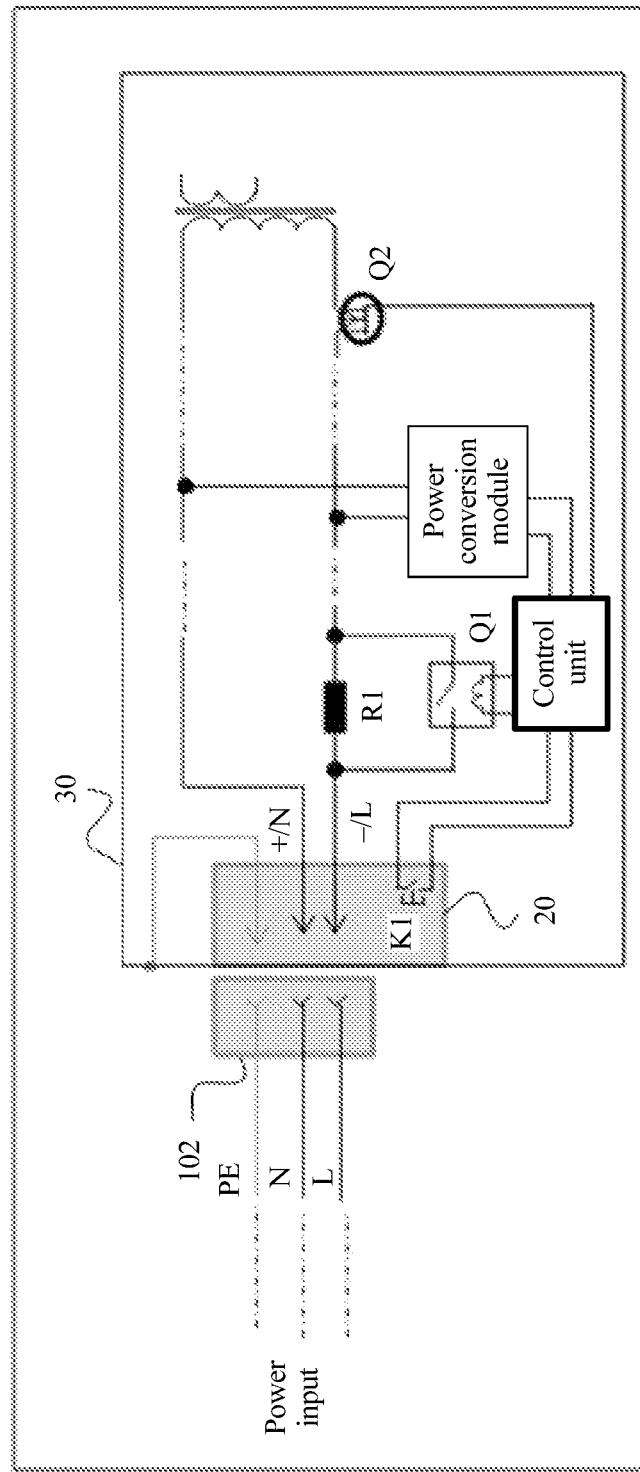
FIG. 5C, FIG. 5D, FIG. 5E, and FIG. 5F are schematic diagrams of connections between an alternating current connector, an appliance input socket, and an ICT device.
Figure 5D:
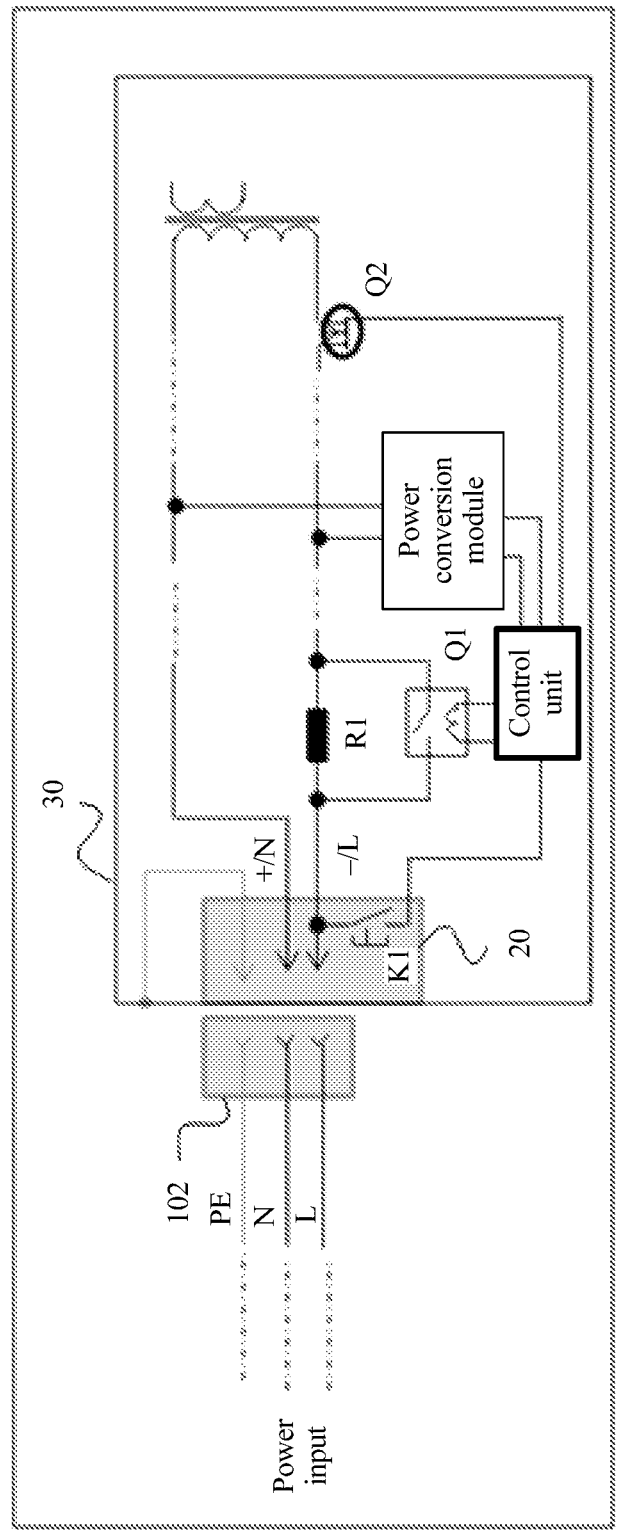
Figure 5E:
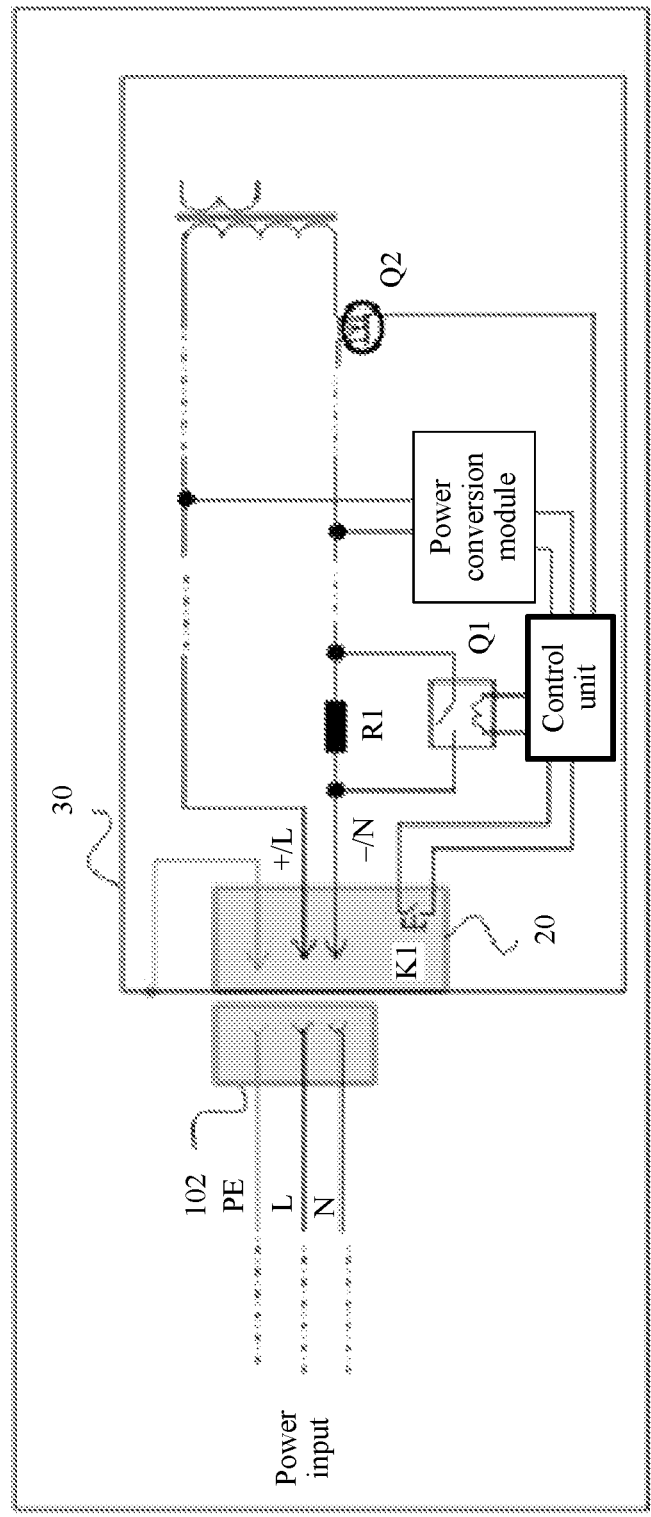
Figure 5F:
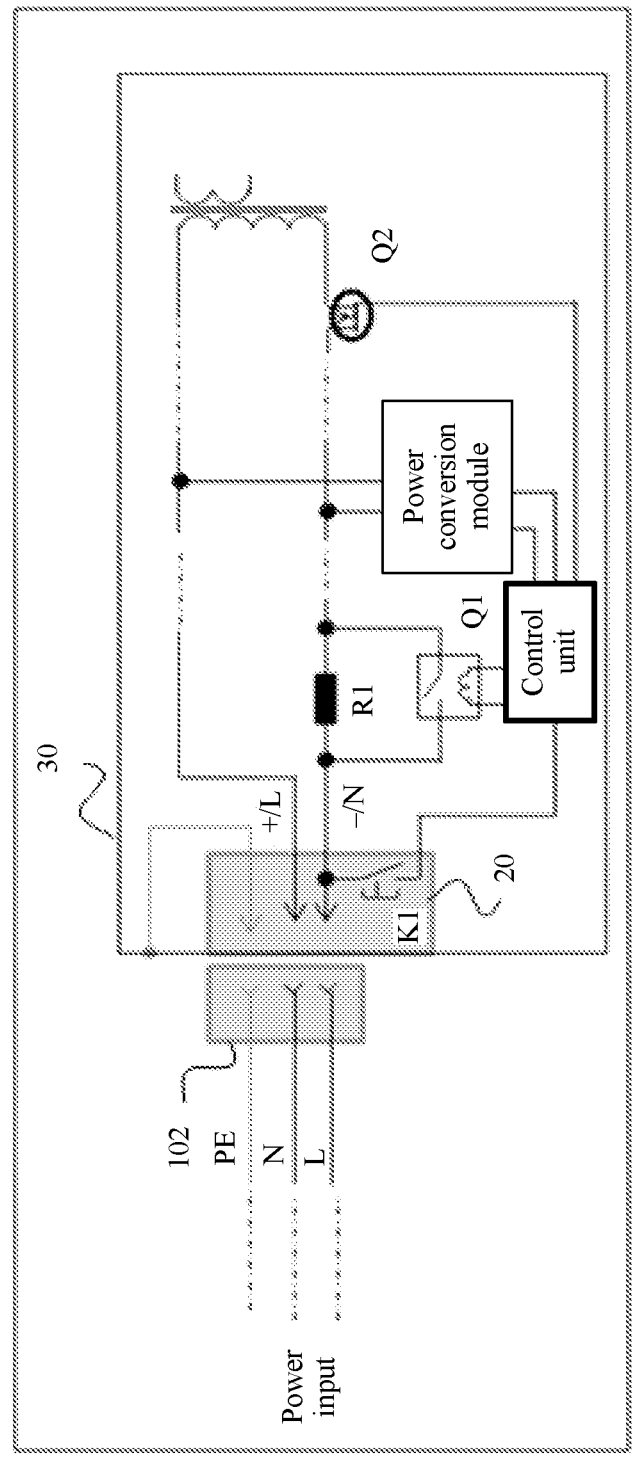

As shown in FIG. 5A or FIG. 5B, a control circuit and a transformer coil are disposed inside the ICT device 30. The control circuit includes a control unit, a semiconductor switch Q2, a start resistor R1, and a relay Q1.

The control unit is connected to two conductive electrodes of the appliance input socket 20. Optionally, the control unit is connected to two conductive electrodes of the appliance input socket 20 by using a power conversion module, and supplies power to the appliance input socket 20 by using the power conversion module. The power conversion module can convert a voltage that is output between the conductive electrode into a working voltage of the control unit.

The control unit is separately connected to the signal switch K1, the relay Q1, and the semiconductor switch Q2, and can control the signal switch K1, the relay Q1, and the semiconductor switch Q2. The start resistor R1 is connected to the relay Q1 in parallel, and is connected to a connection line between a conductive electrode of the appliance input socket 20 and the transformer coil. FIG. 5A and FIG. 5B show that the start resistor R1 is connected to a connection line between a negative conductive electrode of the appliance input socket 20 and the transformer coil after the start resistor is connected to the relay Q1 in parallel. Optionally, the start resistor R1 may be connected to a connection line between a positive conductive electrode of the appliance input socket 20 and the transformer coil after the start resistor is connected to the relay Q1 in parallel. A first end and a second end of the semiconductor switch Q2 are connected to a connection line between a conductive electrode of the appliance input socket 20 and the transformer coil, and a third end of the semiconductor switch Q2 is connected to the control unit. FIG. 5A and FIG. 5B show that the first end and the second end of the semiconductor switch Q2 are connected to the connection line between the negative conductive electrode of the appliance input socket 20 and the transformer coil. Optionally, the first end and the second end of the semiconductor switch Q2 may be connected to the connection line between the positive conductive electrode of the appliance input socket 20 and the transformer coil.

Optionally, the semiconductor switch Q2 is a transistor, or the semiconductor switch Q2 is a combination of at least two transistors.

The control unit is configured to: after the control signal generated by the signal switch K1 is received, control the semiconductor switch Q2 to enter a disconnected state, so that the ICT device 30 disconnects the appliance input socket 20 from the conductive electrode of the direct current connector 101 after the ICT device enters a no load state.

In this way, when the appliance input socket 20 is separated from the conductive electrode of the direct current connector 101, a breaking current is basically zero during conductive electrode separation because the ICT device 30 enters a no load state, thereby preventing the appliance coupler from generating a dangerous direct current arc.

Further, after the connector 10 is inserted into the appliance input socket 20, the connector 10 may be the direct current connector 101 or an alternating current connector 102. The control unit is further configured to: when power input is detected, control the relay Q1 to enter a startup state. Because the relay Q1 is in a shutdown state by default, when the connector 10 is inserted into the appliance input socket 20, a startup current inside the ICT device 30 is extremely small under action of the start resistor R1, and an arc generated during startup of the appliance coupler is controlled to an acceptable degree. After a preset duration, the control unit controls the relay Q1 to be connected and to enter a normal working state.

An example is used to describe working processes of the appliance coupler and the ICT device in FIG. 5A and FIG. 5B.

Before the direct current connector 101 is inserted into the appliance input socket 20, the signal switch K1 is in a first state. When the direct current connector 101 is inserted into the appliance input socket 20, a startup current inside the ICT device 30 is extremely small under action of the start resistor R1, and an arc generated during startup of the appliance coupler is controlled to an acceptable degree. A signal contact on the direct current connector 101 is in contact with the signal switch K1 on the appliance input socket 20, to trigger the signal switch K1 to enter a second state. After a preset duration, the control unit controls the relay Q1 to be connected and to enter a normal working state. Further, when the direct current connector 101 is separated from the appliance input socket 20, before the direct current connector 101 is disconnected from the conductive electrode of the appliance input socket 20, the signal contact on the direct current connector 101 and the signal switch K1 on the appliance input socket 20 are first disconnected, to trigger the signal switch K1 to enter the first state. After a state of the signal switch K1 changes, the control signal is generated, so that the control unit controls the semiconductor switch Q2 to enter a disconnected state, and after an internal current of the ICT device 30 is zero or close to zero, the appliance input socket 20 is disconnected from the conductive electrode of the direct current connector 101. The first state is different from the second state. Optionally, the first state is a connected state, and the second state is a disconnected state; or the first state is a disconnected state, and the second state is a connected state.

It is worthwhile to note that the appliance input socket 20 is compatible with input of a standard alternating current connector. For details, refer to FIG. 5C, FIG. 5D, FIG. 5E, and FIG. 5F. When the standard alternating current connector 102 is inserted into the appliance input socket 20, the signal switch K1 on the appliance input socket takes no action and remains in an initial state. When the standard alternating current connector 102 is separated from the appliance input socket 20, the signal switch K1 on the appliance input socket still takes no action and remains in the initial state. Optionally, the initial state is the first state. A startup current inside the ICT device 30 is extremely small under action of the start resistor R1, and an arc generated during startup of the appliance coupler is controlled to an acceptable degree. After a preset duration, the control unit controls the relay Q1 to be connected and to enter a normal working state. Further, when the alternating current connector 102 is separated from the appliance input socket 20, the signal switch K1 remains in the initial state, namely, the first state.

The ICT device implements compatibility between alternating current input and HVDC input, and multiplexes an internal circuit of the ICT device. Therefore, costs are relatively low, thereby facilitating popularization.

A person skilled in the art should understand that the embodiments of this application may be provided as a method, a system, or a computer program product. Therefore, this application may use a form of hardware only embodiments, software only embodiments, or embodiments with a combination of software and hardware. Moreover, this application may use a form of a computer program product that is implemented on one or more computer-usable storage media (including but not limited to a disk memory, a CD-ROM, an optical memory, and the like) that include computer usable program code.

This application is described with reference to the flowcharts and/or block diagrams of the method, the device (system), and the computer program product according to the embodiments of this application. It should be understood that computer program instructions may be used to implement each process and/or each block in the flowcharts and/or the block diagrams and a combination of a process and/or a block in the flowcharts and/or the block diagrams. These computer program instructions may be provided for a general-purpose computer, a dedicated computer, an embedded processor, or a processor of any other programmable data processing device to generate a machine, so that the instructions executed by a computer or a processor of any other programmable data processing device generate an apparatus for implementing a specific function in one or more processes in the flowcharts and/or in one or more blocks in the block diagrams.

These computer program instructions may be stored in a computer readable memory that can instruct the computer or any other programmable data processing device to work in a specific manner, so that the instructions stored in the computer readable memory generate an artifact that includes an instruction apparatus. The instruction apparatus implements a specific function in one or more processes in the flowcharts and/or in one or more blocks in the block diagrams.

These computer program instructions may be loaded onto a computer or another programmable data processing device, so that a series of operations and steps are performed on the computer or the another programmable device, thereby generating computer-implemented processing. Therefore, the instructions executed on the computer or the another programmable device provide steps for implementing a specific function in one or more processes in the flowcharts and/or in one or more blocks in the block diagrams.

A person skilled in the art can make various modifications and variations to embodiments of this application without departing from the spirit and scope of the embodiments of this application. This application is intended to cover these modifications and variations provided that they fall within the scope of protection defined by the following claims and their equivalent technologies.

What is claimed is:

1. A direct current connector, comprising:
   a ground contact;
   a positive electrode contact;
   a negative electrode contact; and
   a fixed contact;
   wherein the fixed contact protrudes outside of the direct current connector and is configured to prevent the direct current connector from being inserted into an alternating current appliance input socket having an external shape configured to prevent insertion of the fixed contact;
   wherein the fixed contact is configured to be inserted into a general-purpose appliance input socket having an external shape configured to accommodate the fixed contact, wherein the external shape of the general-purpose appliance input socket is configured to be able to receive both an alternating current connector and the direct current connector;
   wherein the general-purpose appliance input socket comprises:
   a ground contact,
   a positive electrode contact, and
   a negative electrode contact;
   wherein the ground contact, the positive electrode contact, and the negative electrode contact of the general-purpose appliance input socket respectively connect to the ground contact, the positive electrode contact, and the negative electrode contact of the direct current connector when receiving the direct current connector; and
   wherein the ground contact, the positive electrode contact, and the negative electrode contact of the general-purpose appliance input socket respectively connect to a ground contact, a positive electrode contact, and a negative electrode contact of the alternating current connector when receiving the alternating current connector.

2. The direct current connector according to claim 1, wherein the fixed contact distinguishes the direct current connector from the alternating current connector in appearance.

3. The direct current connector according to claim 1, wherein the direct current connector is configured to receive only a high-voltage direct current (HVDC) input.

4. The direct current connector according to claim 1, wherein the fixed contact is configured to be inserted into a direct current appliance input socket having an external shape configured to accommodate the fixed contact.

5. The direct current connector according to claim 4, wherein the fixed contact distinguishes the direct current connector from the alternating current connector in appearance.

6. The direct current connector according to claim 4, wherein the direct current connector is configured to receive only a high-voltage direct current (HVDC) input.

7. A system, comprising:
   a direct current connector, comprising:
   a ground contact;
   a positive electrode contact;
   a negative electrode contact; and
   a fixed contact;
   wherein the fixed contact protrudes outside of the direct current connector and is configured to prevent the direct current connector from being inserted into an alternating current appliance input socket having an external shape configured to prevent insertion of the fixed contact; and
   a general-purpose appliance input socket having an external shape configured to accommodate the fixed contact;
   wherein the fixed contact is configured to be inserted into the general-purpose appliance input socket having the external shape configured to accommodate the fixed contact;
   wherein the external shape of the general-purpose appliance input socket is configured to be able to receive both an alternating current connector and the direct current connector, and wherein the general-purpose appliance input socket comprises:

a ground contact,
a positive electrode contact, and
a negative electrode contact;
wherein the ground contact, the positive electrode contact, and the negative electrode contact of the general-purpose appliance input socket respectively connect to the ground contact, the positive electrode contact, and the negative electrode contact of the direct current connector when receiving the direct current connector; and
wherein the ground contact, the positive electrode contact, and the negative electrode contact of the general-purpose appliance input socket respectively connect to a ground contact, a positive electrode contact, and a negative electrode contact of the alternating current connector when receiving the alternating current connector.

8. The system according to claim 7, wherein the fixed contact distinguishes the direct current connector from the alternating current connector in appearance.

9. The system according to claim 7, wherein the direct current connector is configured to receive only a high-voltage direct current (HVDC) input.

10. The system according to claim 7, wherein the general-purpose appliance input socket further comprises a signal switch configured to generate a control signal based on a connector being separated from the general-purpose appliance input socket.

11. The system according to claim 10, wherein the control signal enables a device to disconnect the general-purpose appliance input socket from a conductive electrode of the connector after the device enters a no-load state.

12. The system according to claim 10, further comprising:
a switch; and
a control unit connected to the general-purpose appliance input socket, wherein the control unit is configured to control the switch to enter a disconnected state.

13. The system according to claim 12, further comprising: a transformer coil connected to the switch.

14. The system according to claim 12, wherein the switch is a semiconductor switch comprising at least one transistor.

15. The system according to claim 12, wherein the control unit comprises a start resistor and a relay, wherein the start resistor is connected to the relay in parallel; and
wherein the control unit is further configured to: after a power input is detected, control the relay to be connected and witch from a shutdown state to a working state.

16. A general-purpose appliance input socket, comprising:
a ground contact;
a positive electrode contact; and
a negative electrode contact;
wherein the general-purpose appliance input socket has an external shape configured to accommodate a fixed contact of a direct current connector, wherein the fixed contact is configured to be inserted into the general-purpose appliance input socket having the external shape configured to accommodate the fixed contact and to prevent the direct current connector from being inserted into an alternating current appliance input socket having an external shape configured to prevent insertion of the fixed contact;
wherein the external shape of the general-purpose appliance input socket is configured to be able to receive both an alternating current connector and the direct current connector;
wherein the ground contact, the positive electrode contact, and the negative electrode contact of the general-purpose appliance input socket respectively connect to a ground contact, a positive electrode contact, and a negative electrode contact of the direct current connector when receiving the direct current connector; and
wherein the ground contact, the positive electrode contact, and the negative electrode contact of the general-purpose appliance input socket respectively connect to a ground contact, a positive electrode contact, and a negative electrode contact of the alternating current connector when receiving the alternating current connector.

17. The general-purpose appliance input socket according to claim 16, wherein the fixed contact distinguishes the direct current connector from the alternating current connector in appearance.

18. The general-purpose appliance input socket according to claim 16, wherein the direct current connector is configured to receive only a high-voltage direct current (HVDC) input.

19. The general-purpose appliance input socket according to claim 16, further comprising a signal switch configured to generate a control signal based on a connector being separated from the general-purpose appliance input socket.

20. The general-purpose appliance input socket according to claim 19, wherein the control signal enables a device to disconnect the general-purpose appliance input socket from a conductive electrode of the connector after the device enters a no-load state.

* * * * *